United States Patent
Sasai

(10) Patent No.: US 9,461,635 B2
(45) Date of Patent: Oct. 4, 2016

(54) SIGNAL PROCESSING CIRCUIT

(71) Applicant: ALPS ELECTRIC CO., LTD., Tokyo (JP)

(72) Inventor: Kiyoshi Sasai, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 135 days.

(21) Appl. No.: 14/573,234

(22) Filed: Dec. 17, 2014

(65) Prior Publication Data

US 2015/0222256 A1    Aug. 6, 2015

(30) Foreign Application Priority Data

Jan. 31, 2014   (JP) ................. 2014-018028

(51) Int. Cl.
   *G06G 7/18*     (2006.01)
   *H03K 5/1252*   (2006.01)
   *H03H 11/12*    (2006.01)
   *G06G 7/186*    (2006.01)
   *G06G 7/184*    (2006.01)

(52) U.S. Cl.
   CPC ............ *H03K 5/1252* (2013.01); *G06G 7/184* (2013.01); *G06G 7/186* (2013.01); *H03H 11/126* (2013.01)

(58) Field of Classification Search
   None
   See application file for complete search history.

(56) References Cited

U.S. PATENT DOCUMENTS

| | | | | |
|---|---|---|---|---|
| 3,986,127 A * | 10/1976 | Ray | .................... | H03H 11/1217 327/344 |
| 5,168,461 A * | 12/1992 | Wu | ...................... | H03H 19/002 708/819 |
| 5,486,796 A | 1/1996 | Ishikawa et al. | | |
| 6,229,348 B1 * | 5/2001 | Matsumoto | ............ | H03H 11/42 327/345 |
| 6,380,790 B1 * | 4/2002 | Denison | ............... | G06G 7/1865 327/344 |
| 6,803,802 B2 * | 10/2004 | Bae | ........................ | G06G 7/186 327/337 |
| 6,914,471 B2 * | 7/2005 | Chang | .................... | G06G 7/186 327/336 |

* cited by examiner

*Primary Examiner* — Tuan T Lam

(74) *Attorney, Agent, or Firm* — Beyer Law Group LLP

(57) ABSTRACT

In an integration mode, since a switch becomes OFF, a positive feedback path from an output terminal of an operational amplifier to a positive input terminal is blocked. Therefore, oscillation can be prevented even when a voltage of a signal line connected to a reference voltage supply point varies due to an impedance of the reference voltage supply point not being 0. In the integration mode, a resistor and a capacitor function as a noise filter. Further, in a reset mode, a switch becomes ON, and charge is accumulated in the capacitor depending on a reference voltage of the reference voltage supply point.

7 Claims, 3 Drawing Sheets

_US 9,461,635 B2_

SIGNAL PROCESSING CIRCUIT

CLAIM OF PRIORITY

This application claims benefit of Japanese Patent Application No. 2014-018028 filed on Jan. 31, 2014, which is hereby incorporated by reference.

BACKGROUND OF THE INVENTION

1. Field of the Invention

The present invention relates to a signal processing circuit that detects capacitance of a measured capacitor.

2. Description of the Related Art

FIG. 5 illustrates a general circuit diagram of a CV amplifier for a capacitance sensor according to the related art. In such a CV amplifier, a capacitance value of a capacitance sensor element varying depending on humidity or acceleration is changed, and a difference between this capacitance value and a reference capacitance value is detected by an IC. Output noise of such a CV amplifier is determined, for example, based on an average value of an output of an operational amplifier 116. Since an average consumption current is determined based on a period of time in which a circuit operates, performance is determined based on sampling operation speed. A voltage of about half of a power supply voltage is usually necessary for a positive input terminal (+) of the operational amplifier 116 of a CV amplifier block due to a limited operation range of the operational amplifier 116. Usually, this voltage is supplied using a voltage of an output terminal of the operational amplifier 116, as illustrated in FIG. 5.

However, when an operation speed of the operational amplifier 116 of the CV amplifier increases, a capacitor C103 on a positive feedback path from the output terminal of the operational amplifier 116 to the positive input terminal (+) causes oscillation since an initial stage of an ADC includes capacitive sampling of the capacitor C103 based on a reference voltage VREF. This is because an input impedance of a place at which the reference voltage VREF is supplied from the outside is low, but is not 0, and thus, the reference voltage VREF varies according to increase or decrease in a line voltage of the positive feedback path. Therefore, the CV amplifier is likely to oscillate due to the positive feedback path including the capacitor C103.

SUMMARY OF THE INVENTION

The present invention provides a signal processing circuit capable of preventing oscillation when there is a positive feedback path from an output terminal to a positive input terminal of an operational amplifier of an integration circuit.

A signal processing circuit of a first invention includes an integration circuit configured to receive a charge signal depending on charge accumulated in a measured capacitor, integrate the charge signal, and convert the charge signal into a voltage signal; and a voltage supply circuit configured to supply a reference voltage to the integration circuit, in which the integration circuit includes an operational amplifier including a negative input terminal that receives the charge signal, a positive input terminal to which the reference voltage is supplied, and an output terminal; a first capacitor provided on a first negative feedback path of the operational amplifier; and a first switch provided on a second negative feedback path provided in parallel with the first negative feedback path, and the voltage supply circuit includes a second capacitor connected to the positive input terminal of the operational amplifier and holding the reference voltage; a second switch provided on a positive feedback path between the output terminal and the positive input terminal of the operational amplifier, the second switch becoming OFF when the first switch is OFF and ON when the first switch is ON; and a reference voltage supply point that supplies the reference voltage to the second capacitor via the second switch in the positive feedback path.

In the signal processing circuit of the first invention, in an integration mode in which the first switch becomes OFF, since the second switch becomes OFF, the positive feedback path from the output terminal of the operational amplifier to the positive input terminal is blocked. Therefore, even when a voltage of the vicinity of the reference voltage supply point varies due to an impedance of the reference voltage supply point not being 0, oscillation can be prevented. In this case, since the reference voltage depending on the accumulated charge of the second capacitor is supplied to the positive power terminal of the operational amplifier, the operational amplifier operates appropriately.

Further, in the signal processing circuit, in a reset mode in which the first switch becomes ON, the second switch becomes ON, and charge is accumulated in the second capacitor from the reference voltage supply point. Therefore, even when the accumulated charge of the second capacitor is reduced, the second capacitor can be charged again. In this case, since a gain of the operational amplifier becomes 1 due to negative feedback, oscillation does not occur even when the positive feedback path is formed.

Preferably, the signal processing circuit of the first invention includes a sample and hold circuit including a third capacitor configured to hold a voltage between the output terminal of the operational amplifier and the reference voltage supply point when the first switch is OFF. When the first switch is OFF, the charge depending on the capacitances of the first capacitor and the third capacitor and the voltage between the output terminal of the operational amplifier and the reference voltage supply point is accumulated and held in the third capacitor.

Preferably, the signal processing circuit of the first invention includes a third switch configured to supply charge accumulated in the third capacitor to a subsequent circuit when the first switch is ON. By causing the third switch to be ON, the charge accumulated in the third capacitor can be supplied to a subsequent circuit.

Preferably, the sample and hold circuit of the signal processing circuit of the first invention further includes a fourth switch configured to cause a connection between the third capacitor and the output terminal of the operational amplifier to be ON/OFF, the fourth switch being OFF when the first switch is ON; a fifth switch configured to cause a connection between the subsequent circuit side of the third capacitor and the reference voltage supply point to be ON/OFF, the fifth switch being OFF when the first switch is ON; and a sixth switch configured to cause a connection between an operational-amplifier output terminal side of the third capacitor and the reference voltage supply point to be ON/OFF, the sixth switch being ON when the first switch is ON.

Preferably, the voltage supply circuit of the signal processing circuit of the first invention further includes a resistor located between the second switch on the positive feedback path and the reference voltage supply point. In the integration mode, the resistor and the second capacitor of the positive feedback path function as a noise filter, such that the reference voltage supplied to the positive input terminal of the operational amplifier can be prevented from being affected by noise. As a result, the noise can be prevented from being sampled and high performance can be realized.

Preferably, the measured capacitor of the signal processing circuit of the first invention is a sensor electrode that causes capacitance between electrodes to vary depending on a state of a measured target.

A signal processing circuit of a second invention includes an integration circuit configured to receive a charge signal depending on charge accumulated in a measured capacitor, integrate the charge signal, and convert the charge signal into a voltage signal; and a voltage supply circuit configured to supply a reference voltage to the integration circuit, in which the integration circuit includes an operational amplifier including a negative input terminal that receives the charge signal, a positive input terminal to which the reference voltage is supplied, and an output terminal; a first capacitor provided on a first negative feedback path of the operational amplifier; and a first switch provided on a second negative feedback path provided in parallel with the first negative feedback path, and the voltage supply circuit includes a reference voltage supply point that supplies the reference voltage to the positive input terminal of the operational amplifier; a second switch provided on a positive feedback path between the output terminal and the positive input terminal of the operational amplifier, the second switch becoming OFF when the first switch is OFF and ON when the first switch is ON; and a second capacitor connected to the reference voltage supply point via the second switch and holding the reference voltage.

In the signal processing circuit of the second invention, in an integration mode in which the first switch becomes OFF, since the second switch becomes OFF, the positive feedback path from the output terminal of the operational amplifier to the positive input terminal is blocked. Therefore, even when a voltage of the vicinity of the reference voltage supply point varies due to an impedance of the reference voltage supply point not being 0, oscillation can be prevented. In this case, since the reference voltage is held at the reference voltage supply point by the second capacitor, the operational amplifier operates based on the reference voltage.

Further, in the signal processing circuit, in a reset mode in which the first switch becomes ON, the second switch becomes ON, and charge is accumulated in the second capacitor from the reference voltage supply point. Therefore, even when the accumulated charge of the second capacitor is reduced, the second capacitor can be charged again. In this case, since a gain of the operational amplifier becomes 1 due to negative feedback, oscillation does not occur even when the positive feedback path is formed.

DESCRIPTION OF THE PREFERRED EMBODIMENTS

Figure 1:
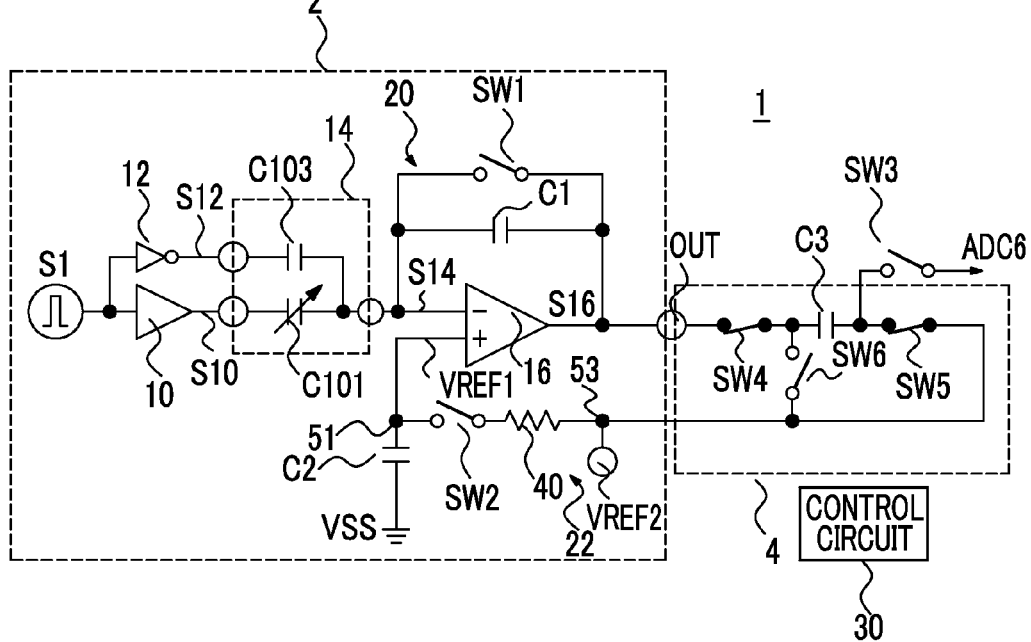
FIG. 1 is a configuration diagram of a signal processing circuit according to a first embodiment of the present invention and is a diagram illustrating an ON/OFF state of switches in an integration mode.

Hereinafter, a signal processing circuit according to embodiments of the present invention will be described.
First Embodiment FIG. 1 is a configuration diagram of a signal processing circuit 1 according to a first embodiment of the present invention. The signal processing circuit 1 includes a capacitance detection circuit 2, a sample and hold circuit 4, an ADC 6, and a control circuit 30. In the signal processing circuit 1, when an integration circuit 20 of the capacitance detection circuit 2 operates in an integration mode, a switch SW2 becomes OFF so that a positive feedback path is not formed. Accordingly, the capacitance detection circuit 1 is prevented from oscillating.

In FIG. 1, a capacitor C101 is an example of a measured capacitor, the integration circuit 20 is an example of an integration circuit of the present invention, a voltage supply circuit 22 is an example of a voltage supply circuit of the present invention, and an operational amplifier 16 is an example of an operational amplifier of the present invention. Further, capacitors C1, C2, and C3 are examples of first, second, and third capacitors of the present invention, respectively. Further, switches SW1, SW2, SW3, SW4, SW5, and SW6 are examples of first, second, third, fourth, fifth, and sixth switches of the present invention, respectively. Further, a reference voltage supply point 53 is an example of a reference voltage supply point of the present invention. Further, a reference voltage VREF1 is an example of a reference voltage of the present invention.

The capacitance detection circuit 2 includes, for example, driving circuits 10 and 12, a sensor 14, the integration circuit 20, and the voltage supply circuit 22. For example, a pulse signal S1 is input from the outside of the signal processing circuit 1 to the driving circuit 10 and the driving circuit 12. When the pulse signal S1 is at a high level and a low level, the driving circuit 10 generates a driving signal S10 for driving the capacitor C101 at a high level and a low level, and supplies the driving signal S10 to the capacitor C101.

When the pulse signal S1 is at a high level and a low level, the driving circuit 12 generates a driving signal S12 for driving a capacitor C103 at a low level and a high level, and supplies the driving signal S12 to the capacitor C103. That is, the driving signals S10 and S12 are in reverse phase.

The sensor 14 includes the capacitors C101 and C103. The capacitor C101 is a capacitance sensor element, and has, for example, capacitance varying depending on humidity, acceleration, or contact of a finger of a user or the like. The capacitor C101 accumulates charge depending on the level of the driving signal S10 and the capacitance depending on the humidity, the acceleration, or the contact of the finger or the like. The capacitor C103 accumulates charge depending on its capacitance and the level of the driving signal S12.

The capacitors C101 and C103 are installed so that the capacitance varies under certain conditions depending on the humidity, the acceleration, or the contact of the finger of the user or the like. Since the driving signals S10 and S12 in reverse phase are supplied to the capacitors C101 and C103, a charge signal S14 depending on a difference between the capacitance of the capacitor C101 and the capacitance (for reference) of the capacitor C103 is input to a negative input terminal (−) of the operational amplifier.

Figure 3A:
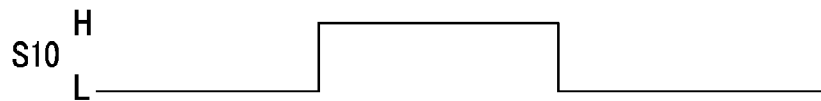
FIGS. 3A to 3D are diagrams illustrating waveforms of respective signals illustrated in FIG. 1.
Figure 3B:
Figure 3C:
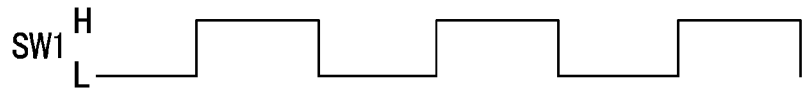
Figure 3D:
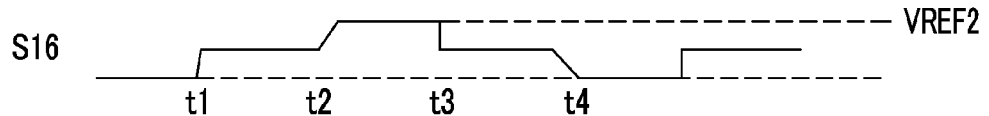

The integration circuit 20 includes the operational amplifier 16, an integration capacitor C1, and the switch SW1. The integration circuit 20 receives the charge signal S14 in a state in which the switch SW1 is OFF, and accumulates the charge in the capacitor C1. On the other hand, the integration circuit 20 resets the accumulated charge of the integration capacitor C1 in a state in which the switch SW1 is ON. Accordingly, a voltage signal S16 output from an output terminal of the operational amplifier 16 is as illustrated in FIG. 3D.

The operational amplifier 16 includes the negative input terminal (−) to which the charge signal S14 from the sensor 14 is supplied, the positive input terminal (+), and the output terminal. The output terminal of the operational amplifier 16 is connected to the negative input terminal (−) via the integration capacitor C1 by a first negative feedback path. Further, the output terminal of the operational amplifier 16 is connected to the negative input terminal (−) via the switch SW1 by a second negative feedback path provided in parallel to the first negative feedback path. The positive input terminal (+) of the operational amplifier 16 is at a reference voltage VREF1 by means of the voltage supply circuit 22.

The voltage supply circuit 22 supplies the reference voltage VREF1 to the positive input terminal (+) of the operational amplifier 16. The voltage supply circuit 22 includes a capacitor C2 having one pole that is at VSS (ground), and the other pole connected to the positive input terminal of the operational amplifier 16. That is, the other pole of the capacitor C2 is at the reference voltage VREF1. Further, the voltage supply circuit 22 includes the switch SW2 located between the other pole of the capacitor C2 and the reference voltage supply point 53, and a resistor 40 located between the switch SW2 and the reference voltage supply point 53.

The reference voltage supply point 53 is at a reference voltage VREF2 due to voltage supply from the outside. An impedance of a voltage supply circuit (not illustrated) that supplies the reference voltage VREF2 is ideally 0, but is not 0 in practice. Accordingly, when a voltage of a signal line connected to the reference voltage supply point 53 varies, the reference voltage VREF2 also varies, the output signal of the operational amplifier 16 is positively fed back to the positive input terminal (+), and oscillation is likely to occur.

In the signal processing circuit 1, when the integration circuit 20 operates in the integration mode as will be described below, the switch SW2 is caused to be OFF so that the positive feedback path is not formed, and the oscillation as described above is prevented.

The sample and hold circuit 4 includes a capacitor C3 and the switches SW4, SW5, and SW6. In the sample and hold circuit 4, the switch SW4, the capacitor C3, and the switch SW5 are sequentially arranged on a path between the output terminal of the operational amplifier 16 and the reference voltage supply point 53. The switch SW6 is provided between a point between the switch SW4 and the capacitor C3 and the reference voltage supply point 53. Further, a point between the capacitor C3 and the switch SW5 is connected to the ADC 6 via the switch SW3.

The sample and hold circuit 4 accumulates charge depending on the voltage signal S16 from the output terminal of the operational amplifier 16 in the capacitor C3 for a certain period of time, and supplies the charge to the ADC 6. The ADC 6 converts the voltage depending on the accumulated charge of the capacitor C3 into a digital signal.

Figure 2:
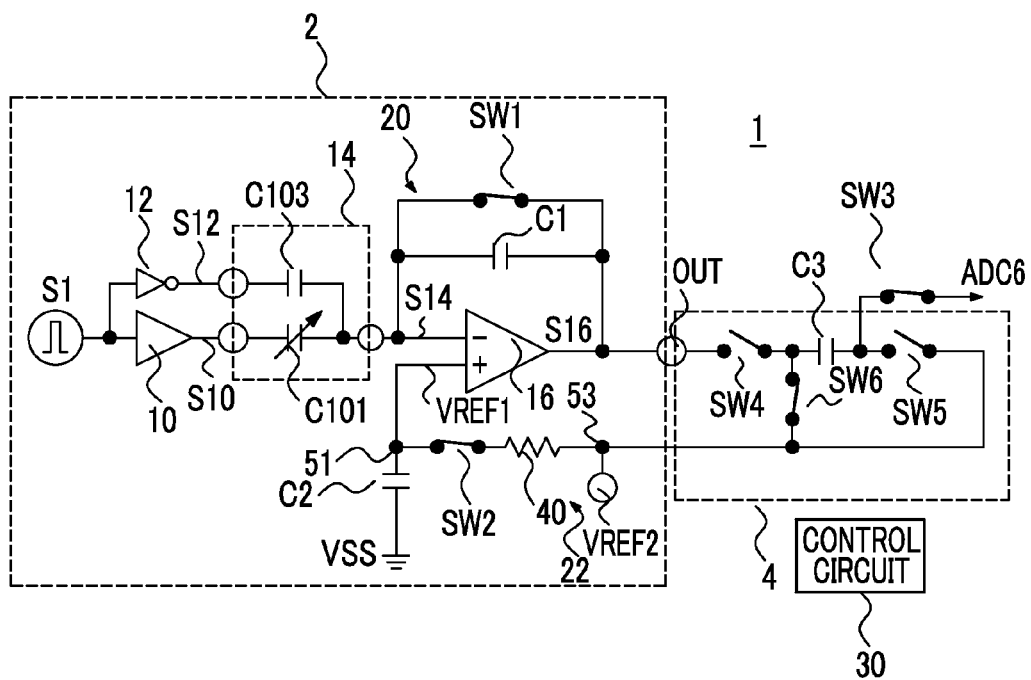
FIG. 2 is a configuration diagram of the signal processing circuit according to the first embodiment of the present invention and is a diagram illustrating an ON/OFF state of the switches in a reset mode.

The control circuit 30 controls ON/OFF of the switches SW1, SW2, SW3, SW4, and SW5. The control circuit 30 performs control to cause the switches SW2, SW3, and SW6 to be OFF and the switches SW4 and SW5 to be ON, as illustrated in FIG. 1, in a period in which the switch SW1 is OFF (a period of the integration mode). On the other hand, the control circuit 30 performs control to cause the switches SW1, SW3, and SW6 to be ON and the switches SW4 and SW5 to be OFF as illustrated in FIG. 2 in a period in which the switch SW1 is ON (a period of a reset mode).

Hereinafter, an operation example of the signal processing circuit 1 will be described.

The pulse signal S1 is supplied to the driving circuits 10 and 12. The driving circuit 10 supplies the driving signal S10 illustrated in FIG. 3A to the capacitor C101 in response to the pulse signal S1. In parallel to this, the driving circuit 12 supplies the driving signal S12 illustrated in FIG. 3B, which is in reverse phase with the driving signal S10, to the capacitor C103 in response to the pulse signal S1.

Also, the capacitor C101 accumulates charge depending on the level of the driving signal S10 and its capacitance. The capacitance has a value depending on humidity, acceleration, or contact of the finger of the user or the like. Further, the capacitor C103 accumulates charge depending on its capacitance and the level of the driving signal S12. Since the driving signals S10 and S12 in reverse phase are supplied to the capacitors C101 and C103, the charge signal S14 depending on a difference between the capacitance of the capacitor C101 and the capacitance of the capacitor C103 is input to the negative input terminal (−) of the operational amplifier.

The charge signal S14 is integrated in the integration circuit 20, and the voltage signal S16 illustrated in FIG. 3D is generated at the output terminal of the operational amplifier 16. As illustrated in FIGS. 3A and 3C, the control circuit 30 performs control to cause the switch SW1 to be OFF in a first half of a period in which the driving signal S10 is at a high level and to cause the switch SW1 to be ON in a second half.

The integration circuit 20 enters the integration mode in which the charge depending on the charge signal S14 is accumulated in the integration capacitor C1 in a state in which the switch SW1 is OFF. On the other hand, the integration circuit 20 enters the reset mode in which the accumulated charge of the integration capacitor C1 is reset in a state in which the switch SW1 is ON. According to ON/OFF of the switch SW1, the voltage signal S16 illustrated in FIG. 3D is generated at the output terminal of the operational amplifier 16.

Hereinafter, an operation in the integration mode and the reset mode described above will be described.

Integration Mode

In the integration mode, the switches SW1, SW2, SW3, and SW6 in the capacitance detection circuit 2 are OFF and the switches SW4 and SW5 are ON, as illustrated in FIG. 1. The operational amplifier 16 outputs the voltage signal S16 so that the voltage of the negative input terminal (−) becomes the reference voltage VREF1 depending on the accumulated charge of the capacitor C2.

In the signal processing circuit 1, in the integration mode, the switch SW2 is OFF, and thus, the positive feedback path from the output terminal of the operational amplifier 16 to the positive input terminal (+) is blocked. In this case, the reference voltage VREF1 depending on the accumulated charge of the capacitor C2 is supplied to the positive input terminal (+) of the operational amplifier 16. Since the positive feedback path is blocked in this way, the operational amplifier 16 does not oscillate even when the voltage of the signal line connected to the reference voltage supply point 53 varies.

Reset Mode

In the reset mode, in the capacitance detection circuit 2, the switches SW1, SW2, SW3, and SW6 are ON and the switches SW4 and SW5 are OFF, as illustrated in FIG. 2. The operational amplifier 16 outputs the voltage signal S16 so that the voltage of the negative input terminal (−) becomes the reference voltage VREF1 depending on the accumulated charge of the capacitor C2. In the reset mode, the switch SW4 is OFF and the switches SW3 and SW6 are ON, and thus, the voltage depending on the charge accumulated in the capacitor C3 is converted into a digital signal by the ADC 6.

In the reset mode, the switch SW2 in the signal processing circuit 1 is ON, and the charge is accumulated in the capacitor C2 depending on the reference voltage VREF2 of the reference voltage supply point 53. In this case, since an amplification factor of the operational amplifier 16 is 1, the oscillation does not occur even when the positive feedback path is formed.

An operation of the signal processing circuit 1 will be described with reference to the voltage levels of the driving signals S10 and S12, ON/OFF of the switch SW1, and the voltage level of the voltage signal S16 illustrated in FIGS. 3A to 3D.

At a timing t1 illustrated in FIGS. 3A to 3D, when the switch SW1 is ON and is in a reset state in a state in which the voltage signal S16 is 0 V, the switch SW2 is ON, and the voltages of the voltage signal S16 of the operational amplifier 16 and the negative input terminal (−) match. In this case, since the switch SW2 is ON, the voltage of the reference voltage point 51 (the positive input terminal (+)) becomes the reference voltage VREF2. Therefore, the voltage signal S16 also becomes the reference voltage VREF2.

Then, at a timing t2 illustrated in FIGS. 3A to 3D, when the switch SW1 is OFF and a mode becomes the integration mode, the charge depending on the charge signal S14 is accumulated in the integration capacitor C1 based on the reference voltage VREF2, and accordingly, the level of the voltage signal S16 rises until the integration capacitor C1 enters a saturation state. In this case, the driving signal S10 is at a high level, the driving signal S12 is at a low level, and a resultant charge signal S14 is supplied to the negative input terminal (−) of the operational amplifier 16. Further, since the switch SW2 is OFF, the reference voltage point 51 becomes the voltage depending on the accumulated charge of the capacitor C2. Further, the charge depending on a voltage obtained by dividing the voltage between the negative input terminal (−) of the operational amplifier 16 and the reference voltage supply point 53 by capacitance of the capacitor C1 and the capacitor C3 is accumulated in the capacitor C3.

Then, at a timing t3 illustrated in FIGS. 3A to 3D, when the switch SW1 is ON and a mode becomes the reset mode, the voltage signal S16 becomes a level of the negative input terminal (−), that is, the reference voltage VREF2. Further, the switch SW4 becomes OFF, and the switches SW7 and SW9 become ON. Also, the ADC 6 converts the voltage depending on the accumulated charge of the capacitor C3 into a digital signal. Further, since the switch SW2 becomes ON, the charge depending on the reference voltage VREF2 of the reference voltage supply point 53 is accumulated in the capacitor C2.

Then, at a timing t4 illustrated in FIGS. 3A to 3D, when the switch SW1 becomes OFF and a mode becomes the integration mode, the charge depending on the charge signal S14 is accumulated in the capacitor C1 based on the reference voltage VREF2, and accordingly, the level of the voltage signal S16 drops until the capacitor C1 enters an saturation state. In this case, the driving signal S10 is at a low level, and the driving signal S12 is at a high level, which is reverse to the case of the timing t2 described above. Therefore, a polarity of the charge accumulated in the capacitor C1 is reverse to that in the case of the timing t2, and the level of the voltage signal S16 drops.

As described above, according to the signal processing circuit 1, since the switch SW2 is OFF in the integration mode, the positive feedback path from the output terminal of the operational amplifier 16 to the positive input terminal (+) is blocked. Therefore, even when the voltage of the signal line connected to the reference voltage supply point 53 varies due to the impedance of the reference voltage supply point 53 not being 0, it is possible to prevent the capacitance detection circuit 2 from oscillating. In this case, since the reference voltage VREF1 depending on the accumulated charge of the capacitor C2 is supplied to the positive input terminal (+) of the operational amplifier 16, the operational amplifier 16 operates appropriately.

Further, according to the signal processing circuit 1, in the integration mode, the resistor 40 and the capacitor C2 function as a noise filter, such that the reference voltage VREF1 supplied to the positive input terminal (+) of the operational amplifier 16 can be prevented from being affected by noise. As a result, the noise can be prevented from being sampled and high performance can be realized.

Further, in the signal processing circuit 1, in the reset mode, the switch SW2 is ON, and the charge is accumulated in the capacitor C2 depending on the reference voltage VREF2 of the reference voltage supply point 53. Therefore, even when the accumulated charge of the capacitor C2 is reduced, the capacitor C2 can be charged again. Further, since a gain of the operational amplifier 16 becomes 1 due to negative feedback, oscillation does not occur even when the positive feedback path is formed.

Second Embodiment

Figure 4:
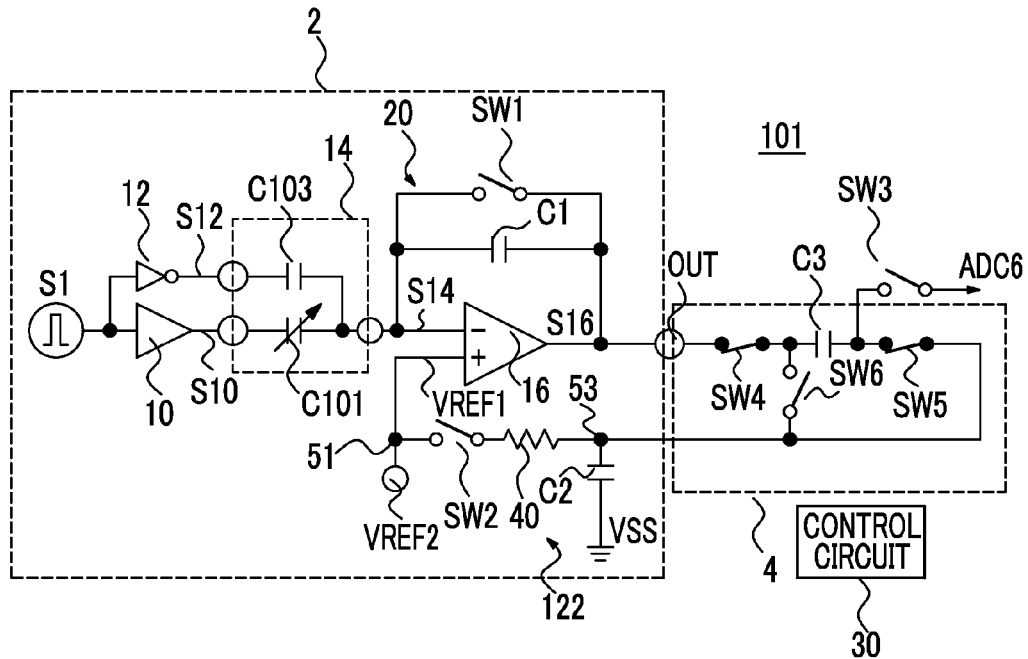
FIG. 4 is a configuration diagram of a signal processing circuit according to a second embodiment of the present invention.
Figure 5:
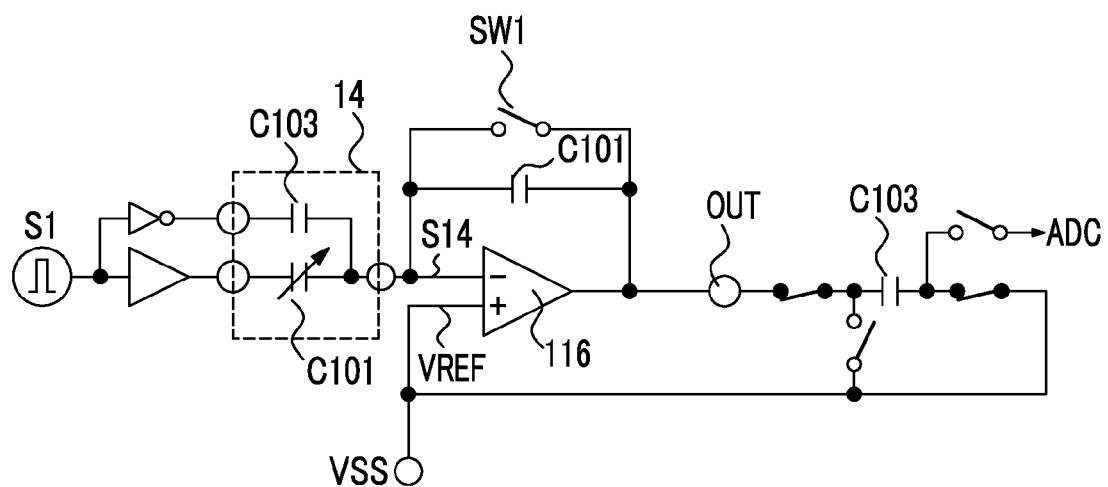
FIG. 5 is a diagram illustrating related art.

FIG. 4 is a configuration diagram of a signal processing circuit 101 according to a second embodiment of the present invention. The signal processing circuit 101 includes, for example, a capacitance detection circuit 102, a sample and hold circuit 4, an ADC 6, and a control circuit 30. In FIG. 4, the same components as in FIG. 1 are denoted with the same reference signs, and description thereof will be omitted.

Hereinafter, the signal processing circuit 101 will be described based on a difference with the signal processing circuit 1.

As illustrated in FIG. 4, a voltage supply circuit 122 supplies a reference voltage VREF2 from an external voltage supply circuit (not illustrated) to a positive input terminal (+) of an operational amplifier 16. A positive feedback path is formed between an output terminal of the operational amplifier 16 and the positive input terminal (+) of the operational amplifier 16.

On the positive feedback path, the switch SW2 and a resistor 40 are provided from the positive input terminal (+) of the operational amplifier 16 to the output terminal, and the resistor 40 is connected to the switches SW5 and SW6. A point 53 between the resistor 40 and the switches SW5 and SW6 is connected to VSS via a capacitor C2.

In the signal processing circuit 101, the switch SW2 becomes OFF in an integration mode, as in the first embodiment. Oscillation is prevented. Further, the reference voltage VREF2 is supplied from the external voltage supply circuit to the positive input terminal (+) of the operational amplifier 16.

Here, an impedance of the voltage supply circuit that supplies the reference voltage VREF2 is ideally infinite. Since the impedance is not 0 in practice, the reference voltage VREF2 also varies. However, since the positive feedback path is blocked, the signal processing circuit 101 does not oscillate. Further, since a point 53 becomes a voltage depending on the accumulated charge of the capacitor C2, the sample and hold circuit 4 appropriately operates, as in the first embodiment. Further, in the reset mode, the switch SW2 is ON, and the charge is accumulated in the capacitor C2 depending on the reference voltage VREF2.

As described above, according to the signal processing circuit 101, since the switch SW2 becomes OFF in the integration mode, it is possible to effectively prevent the circuit from oscillating, as in the first embodiment.

The present invention is not limited to the above-described embodiments. That is, a person skilled in the art may perform various changes, combinations, sub-combinations, or replacements on the components of the above-described embodiments within a technical scope or its equivalent scope of the present invention. For example, in the configurations illustrated in FIGS. 1 and 4, the present invention is applicable even when the resistor 40 is not provided. Further, configurations of the sensor 14, the integration circuit 20, the voltage supply circuit 22, the sample and hold circuit 4, and the like are not particularly limited.

The present invention is applicable to a system that detects capacitance of a measured capacitor.

It should be understood by those skilled in the art that various modifications, combinations, sub-combinations, and alterations may occur depending on design requirements and other factors insofar as they are within the scope of the appended claims of the equivalents thereof.

What is claimed is:

1. A signal processing circuit comprising:
    an integration circuit configured to receive a charge signal corresponding to a charge accumulated in a capacitor to be measured, integrate the charge signal, and convert the charge signal into a voltage signal; and
    a voltage supply circuit configured to supply a reference voltage to the integration circuit,
    wherein the integration circuit includes:
        an operational amplifier having a negative input terminal that receives the charge signal, a positive input terminal that receives the reference voltage, and an output terminal;
        a positive feedback path from the output terminal to the positive input terminal of the operational amplifier;
        a first negative feedback path from the output terminal to the negative input terminal of the operational amplifier;
        a second negative feedback path from the output terminal to the negative input terminal of the operational amplifier, the second negative feedback path being in parallel with the first negative feedback path;
        a first capacitor provided on the first negative feedback path; and
        a first switch provided on the second negative feedback path, and
    wherein the voltage supply circuit includes:
        a second capacitor connected to the positive input terminal of the operational amplifier, the second capacitor holding the reference voltage;
        a second switch provided on the positive feedback, the second switch becoming OFF when the first switch is OFF, and becoming ON when the first switch is ON; and
        a reference voltage supply point provided on the positive feedback path, the reference voltage supply point supplying the reference voltage to the second capacitor via the second switch.

2. The signal processing circuit according to claim 1, further comprising:
    a sample and hold circuit including a third capacitor having a first terminal and a second terminal, the first terminal being coupled to the output terminal of the operational amplifier, the third capacitor being configured to hold a voltage between the output terminal of the operational amplifier and the reference voltage supply point when the first switch is OFF.

3. The signal processing circuit according to claim 2, further comprising:
    a third switch coupled to the second terminal of the third capacitor, the third switch being configured to supply a charge accumulated in the third capacitor to a subsequent circuit when the first switch is ON.

4. The signal processing circuit according to claim 2, wherein the sample and hold circuit further includes:
    a fourth switch provided between the output terminal of the operational amplifier and the first terminal of the third capacitor, the fourth switch being OFF when the first switch is ON;
    a fifth switch provided between the second terminal of the third capacitor and the reference voltage supply point, the fifth switch being OFF when the first switch is ON; and
    a sixth switch provided between the first terminal of the third capacitor and the reference voltage supply point, the sixth switch being ON when the first switch is ON.

5. The signal processing circuit according to claim 1, wherein the voltage supply circuit further includes:
    a resistor provided on the positive feedback path between the second switch and the reference voltage supply point.

6. The signal processing circuit according to claim 1, wherein the capacitor to be measured is a sensor element which changes a capacitance thereof depending on a state of a target to be measured.

7. A signal processing circuit comprising:
    an integration circuit configured to receive a charge signal corresponding to a charge accumulated in a capacitor to be measured, integrate the charge signal, and convert the charge signal into a voltage signal; and
    a voltage supply circuit configured to supply a reference voltage to the integration circuit,
    wherein the integration circuit includes:
        an operational amplifier having a negative input terminal that receives the charge signal, a positive input terminal that receives the reference voltage, and an output terminal;
        a positive feedback path from the output terminal to the positive input terminal of the operational amplifier;
        a first negative feedback path from the output terminal to the negative input terminal of the operational amplifier;
        a second negative feedback path from the output terminal to the negative input terminal of the operational amplifier, the second negative feedback path being provided in parallel with the first negative feedback path;

a first capacitor provided on the first negative feedback path; and
  a first switch provided on the second negative feedback path, and
wherein the voltage supply circuit includes:
  a reference voltage supply point provided on the positive feedback path, the reference voltage supply point supplying the reference voltage to the positive input terminal of the operational amplifier;
  a second switch provided on the positive feedback path, the second switch becoming OFF when the first switch is OFF, and becoming ON when the first switch is ON; and
  a second capacitor coupled to the reference voltage supply point via the second switch, the second capacitor holding the reference voltage.

* * * * *